United States Patent [19]
Mabuchi et al.

[11] Patent Number: 6,091,045
[45] Date of Patent: *Jul. 18, 2000

[54] PLASMA PROCESSING APPARATUS UTILIZING A MICROWAVE WINDOW HAVING A THINNER INNER AREA

[75] Inventors: Hiroshi Mabuchi, Amagasaki; Junya Tsuyuguchi, Nishinomiya; Katsuo Katayama, Amagasaki; Toshihiro Hayami, Nishinomiya; Hideo Ida, Oume; Tomomi Murakami, Amagasaki; Naohiko Takeda, Nishinomiya, all of Japan

[73] Assignee: Sumitomo Metal Industries, Inc., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/952,779
[22] PCT Filed: Mar. 27, 1997
[86] PCT No.: PCT/JP97/01071
§ 371 Date: Nov. 26, 1997
§ 102(e) Date: Nov. 26, 1997
[87] PCT Pub. No.: WO97/36462
PCT Pub. Date: Oct. 2, 1997

[30]  Foreign Application Priority Data

Mar. 28, 1996 [JP] Japan .................................... 8-073467
Jan. 31, 1997 [JP] Japan .................................... 9-018912

[51] Int. Cl.$^7$ .................................................. B23K 10/00
[52] U.S. Cl. ..................... 219/121.43; 219/746; 219/695; 219/121.4; 156/345; 118/723 MW; 204/298.38
[58] Field of Search ........................... 219/121.43, 121.4, 219/121.52, 746, 745, 695, 121.36; 156/345; 204/298.37, 298.35; 118/723 MW

[56]  References Cited

U.S. PATENT DOCUMENTS 5,645,644 7/1997 Mabuchi et al. ................ 118/723 MW
5,874,706 2/1999 Ishii et al. .......................... 219/121.43

FOREIGN PATENT DOCUMENTS

| 62-5600 | 1/1987 | Japan . |
| 6-112138 | 4/1994 | Japan . |
| 6-120155 | 4/1994 | Japan . |
| 8-236296 | 9/1996 | Japan . |
| WO 92/22085 | 12/1992 | WIPO . |

*Primary Examiner*—Mark Paschall
*Attorney, Agent, or Firm*—Armstrong, Westerman, Hattori, McLeland & Naughton

[57]  ABSTRACT

A plasma processing apparatus and a plasma processing method used in etching, ashing, CVD, etc. in the manufacturing, etc. of large-scale integrated circuits (LSIs) and liquid crystal display panels (LCDs). The plasma processing apparatus includes a dielectric plate used for the passage of a microwave, a microwave window disposed to confront the dielectric plate, and a reaction chamber in which a sample stage is disposed to confront the microwave window. The apparatus is characterized in that the microwave window has a recess in the area confronting the sample stage. The plasma processing method is characterized by implementing a plasma process for a sample with the plasma processing apparatus. The method and apparatus are capable of raising the plasma density in the area confronting the sample, improving the plasma processing rate, improving the etch-through performance for fine hole patterns, and improving the yield of semiconductor devices.

6 Claims, 13 Drawing Sheets

PLASMA PROCESSING APPARATUS UTILIZING A MICROWAVE WINDOW HAVING A THINNER INNER AREA

BACKGROUND OF THE INVENTION

1. Field of the Invention

The present invention relates to a plasma processing apparatus and used for etching, ashing, chemical vapor deposition (CVD), etc. in the manufacturing, etc. of large-scale integrated circuits (LSIs) and liquid crystal display panels (LCDs).

2. Description of the Related Art

Processes based on plasma of reactive gases are adopted widely in the manufacturing of LSIs, LCDs, etc. Particularly, the dry etching technique using plasma is an indispensable fundamental technique for the manufacturing processes of LSIs, LCDs, etc.

Recently, plasma generation apparatuses based on the microwave are used for plasma processings because of the ease of high-density plasma generation as compared with the conventional scheme of using high frequencies around 13.56 MHz.

However, microwave-based plasma generation apparatuses generally involve the problem of generating plasma uniformly over a wide area. The present inventors have attempted to resolve the above-mentioned problem and have proposed a plasma processing apparatus having a dielectric plate in Japanese patent publication JP-A-Sho-62-5600.

Figure 1:
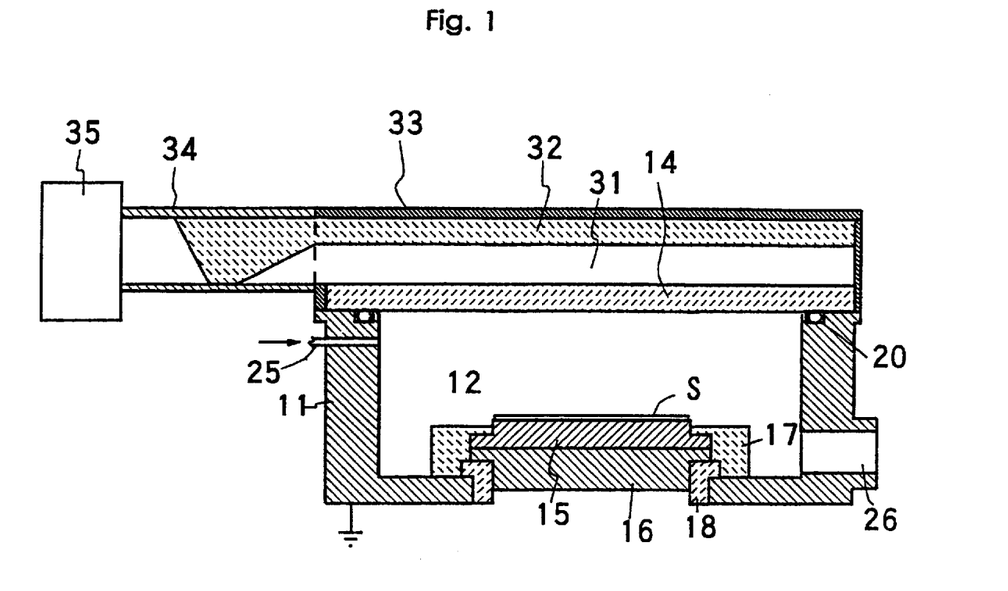
FIG. 1 is a vertical cross-sectional view of the conventional plasma processing apparatus having a dielectric plate.

FIG. 1 is a vertical cross-sectional view of a conventional plasma processing apparatus having a dielectric plate. The apparatus has a reaction chamber 11 (reaction room 12), in which a sample stage 15 is disposed. The top of the reaction room 12 is covered with a microwave window 14 which confronts the sample stage 15, and the reaction room 12 is sealed airtight. A dielectric plate 32 is disposed over the microwave window 14 with a hollow section 31 interposed these between. The microwave window 14 is a flat plate made of quartz glass ($SiO_2$), alumina ($Al_2O_3$) and so on.

A microwave generator 35 generates a microwave, which is supplied to the dielectric plate 32 through a waveguide 34. The microwave propagated in the dielectric plate 32 produces an electric field under the plate 32, and the electric field, exerted in the reaction room 12 through the microwave window 14, causes gas, which is fed to the reaction room 12 through a gas inlet hole 25, to excite and generate plasma. By this plasma, the surface of a sample S undergoes a plasma process such as etching.

This apparatus is also advantageous to generate uniform plasma over a wide area by having a large microwave window 14 and a large dielectric plate 32.

However, the conventional plasma processing apparatus using a dielectric plate is designed to generate plasma over a wide area relative to the sample in order to achieve a uniform plasma processing rate over the entire sample surface. As a result, the apparatus has the problem of a lower plasma density and thus, a lower plasma processing rate, and the problem of the failure of etching off a fine hole pattern down to the bottom.

The present invention is intended to resolve the foregoing problems, and its object is to provide a plasma processing apparatus which is capable of increasing the plasma density in the sample exposure area to thereby improve the plasma processing rate, and which is also capable of improving the etch-through performance for fine hole patterns.

SUMMARY OF THE INVENTION

The plasma processing apparatus of the present invention includes a dielectric plate used for the passage of a microwave, a microwave window disposed to confront the dielectric plate, and a reaction chamber in which a sample stage is disposed to confront the microwave window, wherein the area of the microwave window confronting the sample stage is thinner than the outer area of the microwave window.

The "area confronting the sample stage" mentioned above signifies the area which confronts the area of the sample stage where a sample is placed.

In the case of a plasma processing apparatus using an ordinary dielectric plate, the microwave is mainly propagated in the dielectric plate because of its large dielectric constant relative to the atmosphere, and a standing wave is formed. This microwave has an electric field strength diminishing as an exponential function of the distance from the dielectric plate. Namely, plasma processing apparatuses using a dielectric plate are characterized to introduce the leakage microwave from the dielectric plate (with the microwave's electric field strength diminishing as an exponential function of the distance from the dielectric plate) into the reaction chamber through the microwave window to thereby generate plasma. Consequently, it becomes possible to generate plasma uniformly under the microwave window. Namely, plasma processing apparatuses using a dielectric plate differ in the introduction of the microwave, which diminishes as an exponential function of the distance from the dielectric plate, into the reaction chamber through the microwave window from conventioned electron cyclotron resonance (ECR) plasma processing apparatuses which introduce the microwave directly into the reaction chamber through the microwave window.

The plasma processing apparatus of the present invention has a microwave window with an area confronting the sample on the sample stage which is thinner than the outer area of the microwave window. Accordingly, a plasma density distribution, which is efficient for sample processing, can be accomplished by generating strong plasma in the exposure area of a sample on the sample stage relative to the remaining area. Consequently, it becomes possible to improve the plasma processing rate and also improve the etch-through performance for fine hole patterns.

The plasma processing apparatus of the present invention has microwave window with a thickness that varies depending on the distance from the center immediately above the sample. This microwave window not only achieves a uniform plasma processing for a sample, but can also intentionally speed up the process for the central portion of a sample based on the proper design of the cross-sectional profile of the microwave window.

DETAILED DESCRIPTION OF THE INVENTION

Four embodiments of the plasma processing apparatus and plasma processing method based on the present invention and the results of experiments pertinent to the plasma processing apparatus and plasma processing method of the present invention will be explained with reference to the drawings.

First Embodiment (1) Overall Structure

Figure 2:
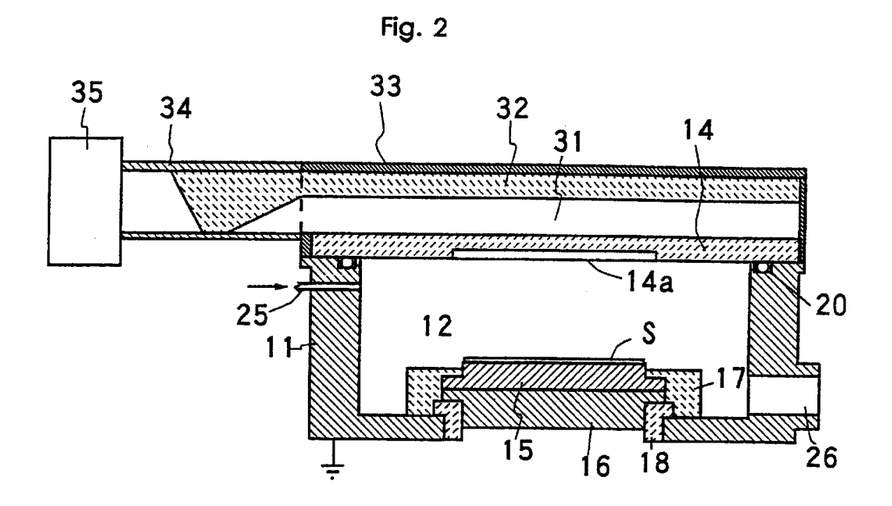
FIG. 2 is a vertical cross-sectional view of a first embodiment of the plasma processing apparatus of the present invention.

FIG. 2 shows in the vertical cross-section of a first embodiment of the plasma processing apparatus of the present invention.

The apparatus has a cuboidal hollow reaction chamber 11 which is generally made of metal such as aluminum or stainless steel. The reaction chamber 11 has a cylindrical reaction room 12 there within.

The top of the reaction room 12 is covered with a microwave window 14, so that the microwave window 14 airtightly seals the reaction room 12 by means of an O-ring 20. The microwave window 14 has a recess 14a formed in its section confronting the sample S. The microwave window 14 will be explained in detail later.

A sample stage 15 is disposed in the reaction room 12 at a position confronting the microwave window 14 and a sample S is placed on the sample stage 15. The sample stage 15 has a chuck mechanism such as an electrostatic chuck (not shown) for holding the sample S and a fluid circulating mechanism (not shown) for circulating a thermal medium for maintaining the sample S at a constant temperature. The sample stage 15 is fixed to a base 16, while being insulated from the reaction chamber 11 by an insulating member 18. The sample stage 15 is surrounded by a plasma shielding member 17.

The reaction chamber 11 has a gas inlet hole 25 formed therein for feeding gas into the reaction room 12 and an evacuation port 26 which communicates with an evacuation device (not shown). The reaction chamber 11 may have a side wall equipped with a heater, etc. so that the reaction chamber 11 is heated to a prescribed temperature.

A dielectric plate 32 is disposed over the reaction chamber 11 to face the microwave window 14 and the top of the dielectric plate 32 is covered with a metallic sheet 33 of aluminum, etc. The dielectric plate 32 is connected to a microwave generator 35 through a waveguide 34. The dielectric plate 32 is suitably made of a material of small dielectric loss, e.g., fluororesin such as Teflon (registered trademark), polyethylene, or polystyrene. The microwave frequency is,for example, 2.45 GHz for example.

(2) Microwave Window

The microwave window 14 is made of a dielectric substance, such as either quartz glass ($SiO_2$) or alumina ($Al_2O_3$), having a high thermal durability, high microwave transmissivity, and small dielectric loss.

The microwave window 14 has an area confronting the sample S which is thinner than the remaining area of the microwave window 14. In other words, the microwave window 14 has a recess formed, for example, by machining in an area confronting the sample S.

The recess has a simple circular or rectangular shape, or else the shape is determined depending on the shape of the sample or in consideration of the uniformity of plasma processing rate. It is preferably circular in general for processing a silicon wafer, for example.

The diameter of recess is determined in order to meet individual purposes, such as uniform plasma processing, higher plasma processing rate for the central portion of a sample, etc. For the higher plasma density and enhanced uniformity, the recess diameter is preferably set 1.0 to 1.2 times the sample diameter. For the higher plasma processing rate which is particularly for the central portion of a sample, the recess diameter is preferably set 0.9 times the sample diameter or smaller.

The depth of the recess is determined to be about 0.1 times or more the thickness of the microwave window in consideration of the plasma processing rate and the uniformity thereof. For example, for the higher plasma processing rate, the recess depth is preferably 4 mm or more when the window thickness is 30 mm, or 2 mm or more when the window thickness is 20 mm. On the other hand, the recess depth should be determined so that a thickness of at least 10 mm is left for ensuring the mechanical durability of the microwave window.

Figure 3:
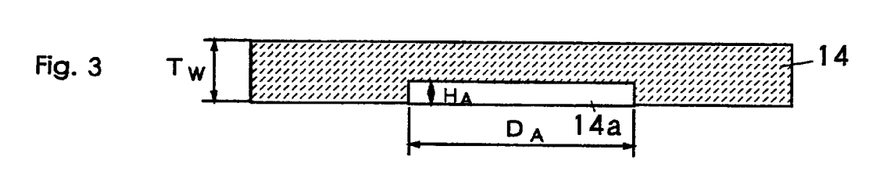
FIG. 3 is a vertical cross-sectional view of an example of the microwave window of the plasma processing apparatus of the present invention.
Figure 4:
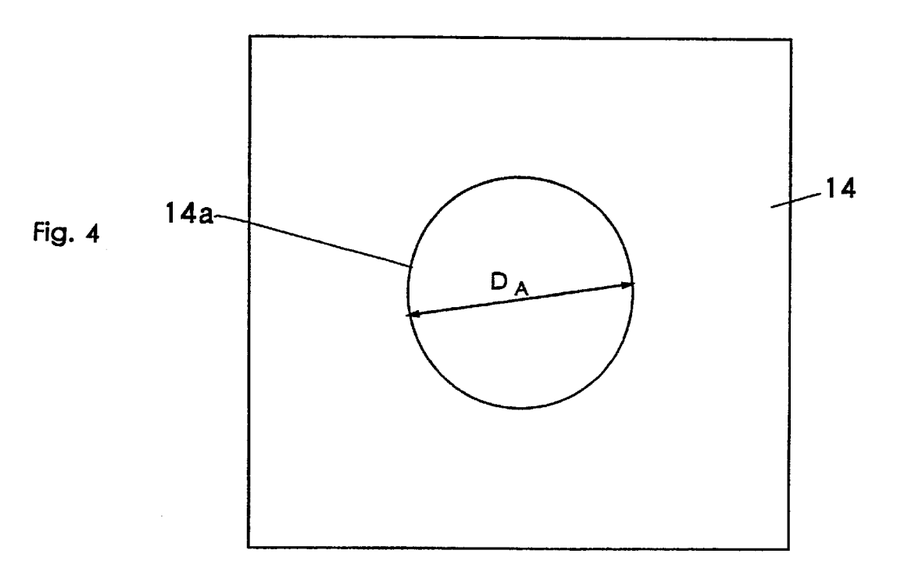
FIG. 4 is a bottom view of the microwave window.

FIG. 3 shows a vertical cross-section of an example of the microwave window, and FIG. 4 is a bottom view there of.

The microwave window 14 has a thickness $T_w$ and a circular recess 14a, with a diameter $D_A$ and depth $H_A$, in a central section there of facing the sample S.

Figure 5:
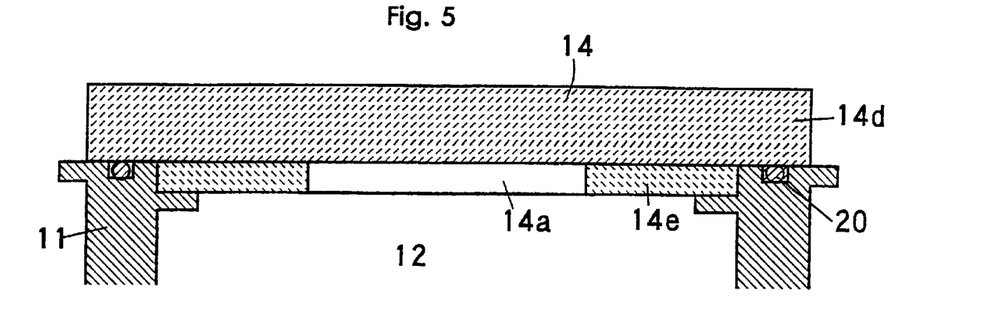
FIG. 5, FIG. 6, FIG. 7 and FIG. 8 are vertical cross-sectional views of other examples of the microwave window of the plasma processing apparatus of the present invention.

FIG. 5 shows a vertical cross-section of another example of the microwave window.

The microwave window 14 includes a window main body 14d and an annular member 14e. Separate parts which constitute the microwave window, as in this example, may be of different materials.

The microwave window of this example will be explained in more detail later in connection with the fourth embodiment.

Figure 6:
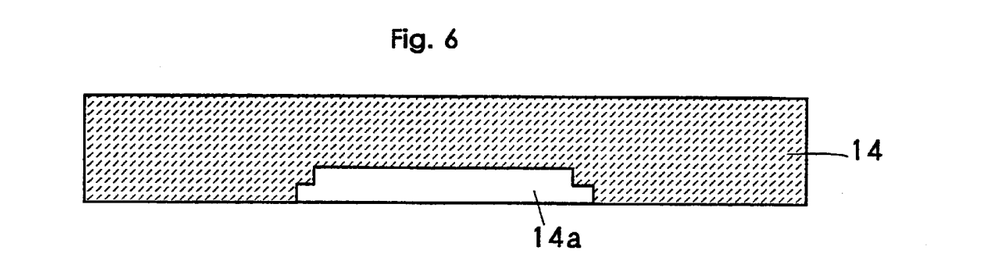
Figure 7:
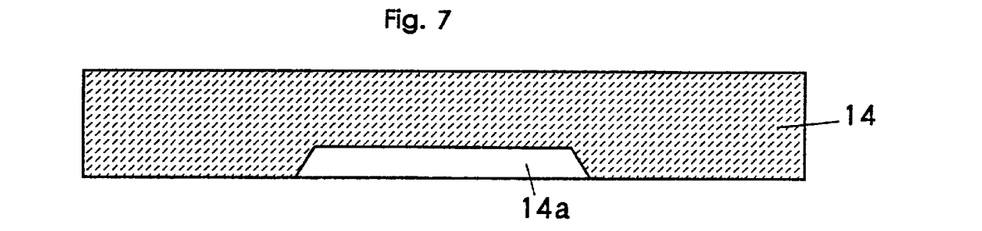

FIG. 6 and FIG. 7 show the vertical cross-section of other examples of the microwave window.

The microwave window has the edge of recess 14a stepped as shown in FIG. 6 or tapered as shown in FIG. 7, or otherwise the edge of recess 14a may be arcuate (curved).

Figure 8:
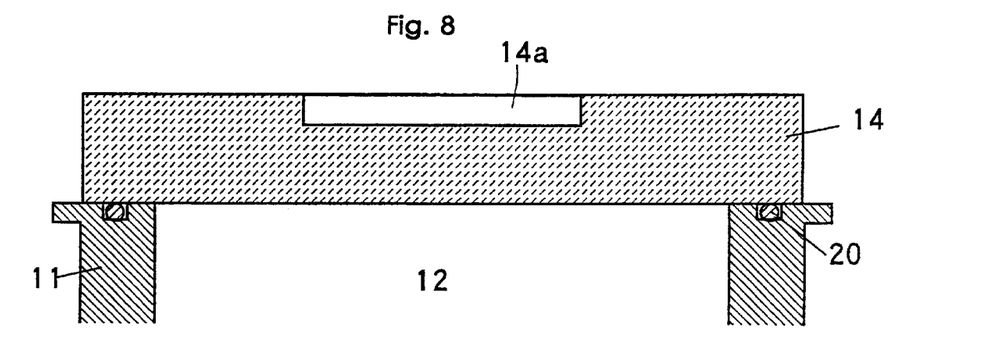

FIG. 8 shows the vertical cross-section of an example of the microwave window having a recess formed on the opposite side far from the reaction room 12, although the recess is more effective when formed in the inner side of the microwave window as mentioned previously.

(3) Method of Plasma Processing

An example of the plasma processing method in the case of etching a sample S will be explained with reference to FIG. 2.

① The reaction room 12 is evacuated of air through the evacuation port 26, and thereafter gas is fed to the reaction room 12 through the gas inlet hole 25.

② The microwave generator 35 is activated to supply the microwave to the dielectric plate 32 through the waveguide 34. The microwave leaking from the dielectric plate 32 goes through the microwave window 14 and enters the reaction room 12, and plasma is generated therein. The sample S is etched by the plasma.

The plasma processing method of the present invention uses the apparatus having a microwave window 14 provided with the recess 14a in a section confronting the sample S. Consequently, it is possible to strengthen the electric field of the microwave and raise the plasma density in the area immediately above the sample S to thereby raise the plasma processing rate for the sample S.

The plasma processing method of the present invention is capable of varying the plasma density distribution by choosing the shape of the recess 14a of the microwave window 14, i.e., choosing the cross-sectional profile of the microwave window 14. Consequently, it becomes possible to process the sample S uniformly, or intentionally raise the plasma processing rate for the central portion of the sample S.

Second Embodiment (1) Overall Structure

Figure 9:
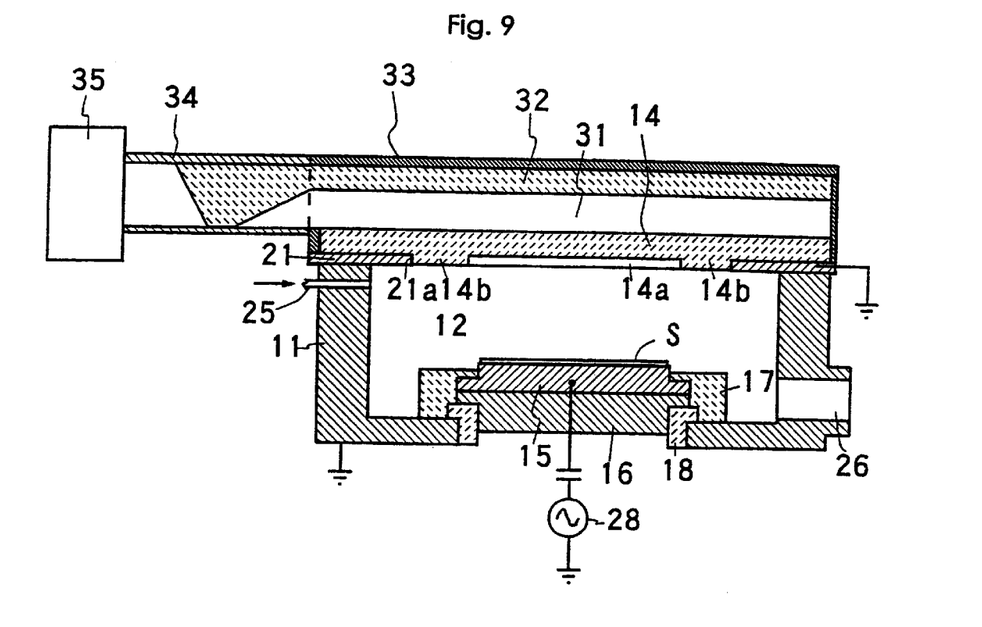
FIG. 9 is a vertical cross-sectional view of a second embodiment of the plasma processing apparatus of the present invention.

FIG. 9 shows a vertical cross-section of a second embodiment of the plasma processing apparatus of the present invention.

The arrangement of the apparatus is derived from the apparatus of FIG. 2, with a radio frequency (RF) voltage source 28 and counter electrode 21 being added thereto so that the apparatus implements a plasma process for a sample S, while applying a RF voltage to the sample S.

The counter electrode 21 is shaped to extend inwardly from the side wall of the reaction chamber 11 at the rim of the microwave window 14, and the counter electrode 21 serves as the grounded electrode against the sample stage 15 to which the RF voltage is applied. The rim section of the microwave window 14 mentioned above signifies the outer area of the microwave window 14 around the central area immediately above the sample S.

By the provision of the counter electrode 21 at this position, the sticking of particles to the sample S and the metallic contamination can be reduced, and in addition, a stable bias voltage can be produced on the sample S. The counter electrode 21 is suitably made of aluminum, with the rendition of an "alumite" process on the surface, etc.

The RF voltage source 28 has a frequency tuned to 400 kHz, 13.56 MHz, etc.

(2) Microwave Window

Figure 10:
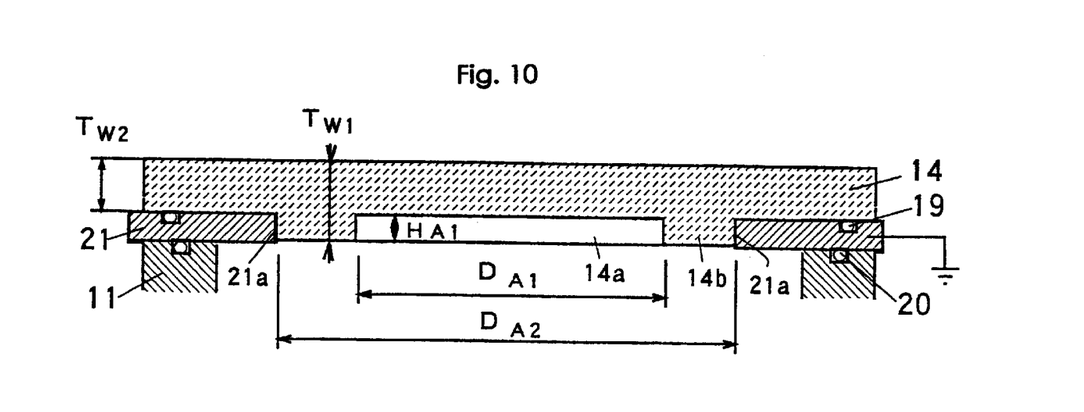
FIG. 10 is a detailed view of the microwave window shown in FIG. 9.

FIG. 10 shows the details of the microwave window in FIG. 9.

The microwave window 14 has a circular recess 14a, with a diameter $D_{A1}$, and a depth $H_{A1}$, as a result of the formation of an annular protrusion 14b having an inner diameter $D_{A1}$, and an outer diameter $D_{A2}$. The annular protrusion 14b also serves to protect the edge section 21a of the counter electrode 21 against plasma.

Figure 11:
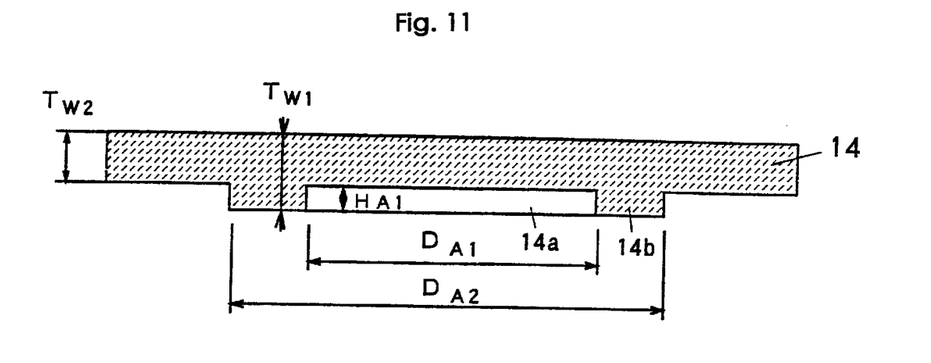
FIG. 11 is a vertical cross-sectional view of an example of the microwave window.
Figure 12:
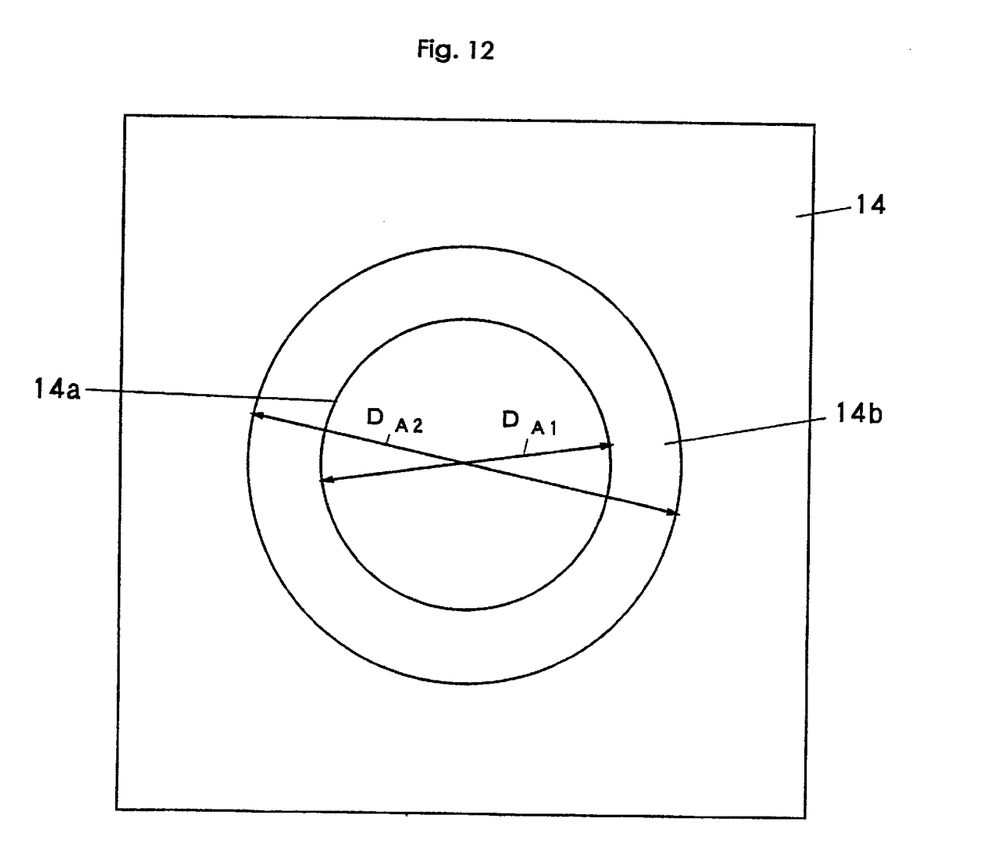
FIG. 12 is a bottom view of the microwave window.

FIG. 11 shows a vertical cross-section of the microwave window, and FIG. 12 is a bottom view thereof.

The microwave window 14 of this shape can increase the plasma density in the area confronting the sample S. In addition, the counter electrode 21 has a surface of an edge section 21a prevented from being sputtered and thus, the creation of particles can be alleviated.

Figure 13:
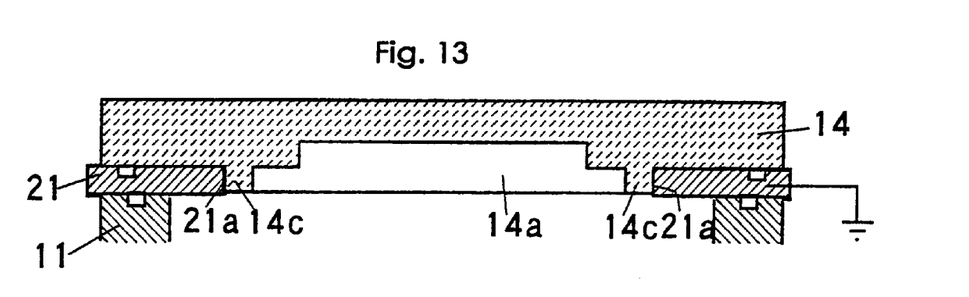
FIG. 13 and FIG. 14 are vertical cross-sectional views of other examples of the microwave window of the plasma processing apparatus of the present invention.

FIG. 13 shows a vertical cross-section of another example of the microwave window.

The microwave window 14 may be shaped as shown for protecting the edge section 21a of the counter electrode 21 against plasma.

Figure 14:
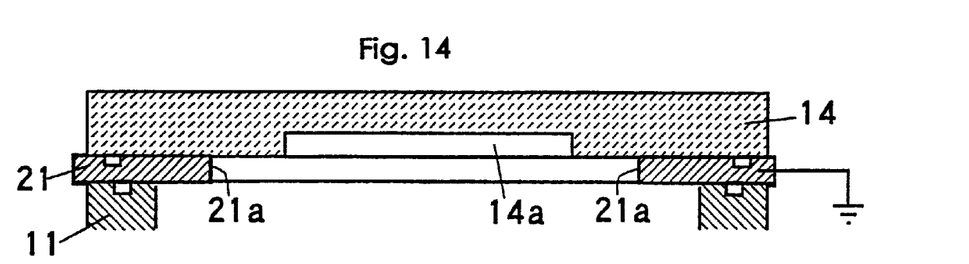

FIG. 14 shows a vertical cross-section of still another example of the microwave window.

In case the creation of particles is not a matter of concern, the structure for protecting the counter electrode edge section 21a against plasma illustrated in these examples need not be adopted.

(3) Method of Plasma Processing

An example of the plasma processing method in the case of etching a sample S with the foregoing plasma processing apparatus will be explained with reference to FIG. 9.

① The reaction room 12 is evacuated of air through the evacuation port 26 and thereafter, gas is fed into the reaction room 12 through the gas inlet hole 25.

② The microwave generator 35 is activated to supply the microwave to the dielectric plate 32 through the waveguide 34. The microwave leaking from the dielectric plate 32 goes through the microwave window 14 and enters the reaction room 12, and plasma is generated therein.

③ Virtually simultaneously to plasma generation, the RF voltage source 28 is activated to apply an RF voltage to the sample stage 15, thereby producing a bias voltage on the surface of the sample S. The sample S is exposed to ions, while the ion energy in plasma is controlled by the adjustment of the bias voltage, thereby etching the surface of the sample S.

The plasma processing method uses the plasma processing apparatus of the first embodiment having the microwave window 14 with the recess 14a formed in the area confronting the sample S. Accordingly, it is possible to strengthen the electric field of the microwave and raise the plasma density in the area immediately above the sample S to thereby raise the plasma processing rate of the sample S, as in the case of the first embodiment. It is also capable of improving the etch-through performance for fine hole patterns.

By properly shaping the recess of the microwave window, the uniformity of plasma processing rate can be improved.

By shaping the microwave window so as to protect the counter electrode surface, the counter electrode edge section can be prevented from being sputtered and the creation of particles can be alleviated.

Third Embodiment

Figure 15:
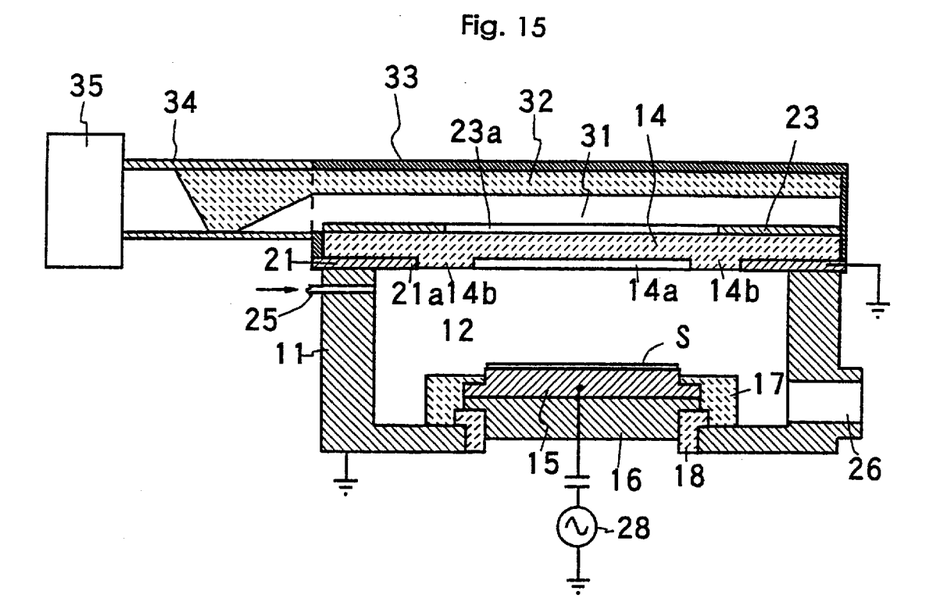
FIG. 15 is a vertical cross-sectional view of a third embodiment of the plasma processing apparatus of the present invention.

FIG. 15 shows a vertical cross-section of the third embodiment of the plasma processing apparatus of the present invention.

The arrangement of the apparatus is derived from the apparatus of FIG. 9, with a microwave regulation plate 23 being laid on the microwave window 14.

Figure 16:
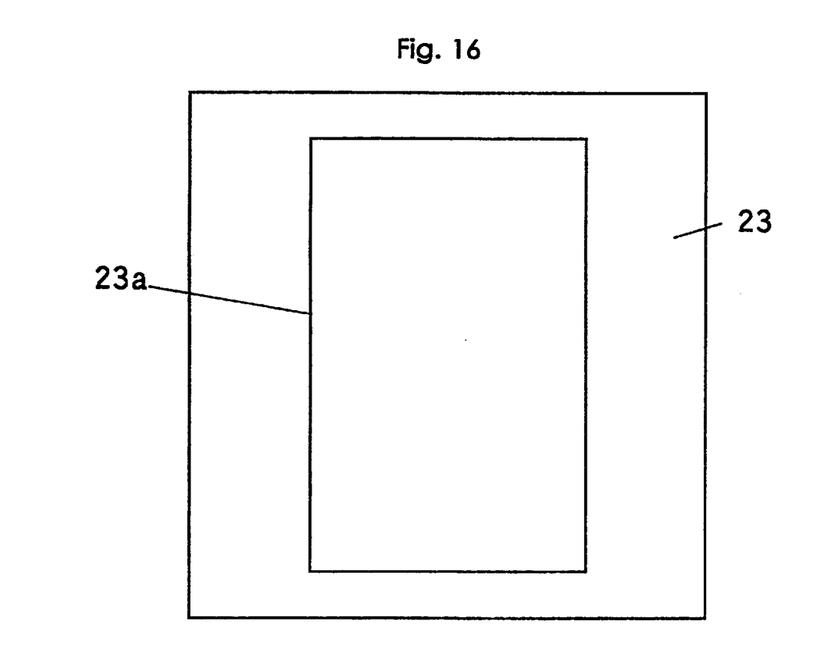
FIG. 16 is a plan view of an example of the microwave regulation plate of the plasma processing apparatus of the present invention.

FIG. 16 is a plan view of an example of the microwave regulation plate 23.

The microwave regulation plate 23 is a metallic plate of aluminum or similar, with an opening 23a being formed in a central section thereof.

The microwave regulation plate 23 functions to limit the microwave passage into the reaction room 12 to thereby confine the plasma generation area. Consequently, it becomes possible to further raise the plasma density in the area over the sample S and manipulate the plasma density distribution.

Fourth Embodiment

Figure 17:
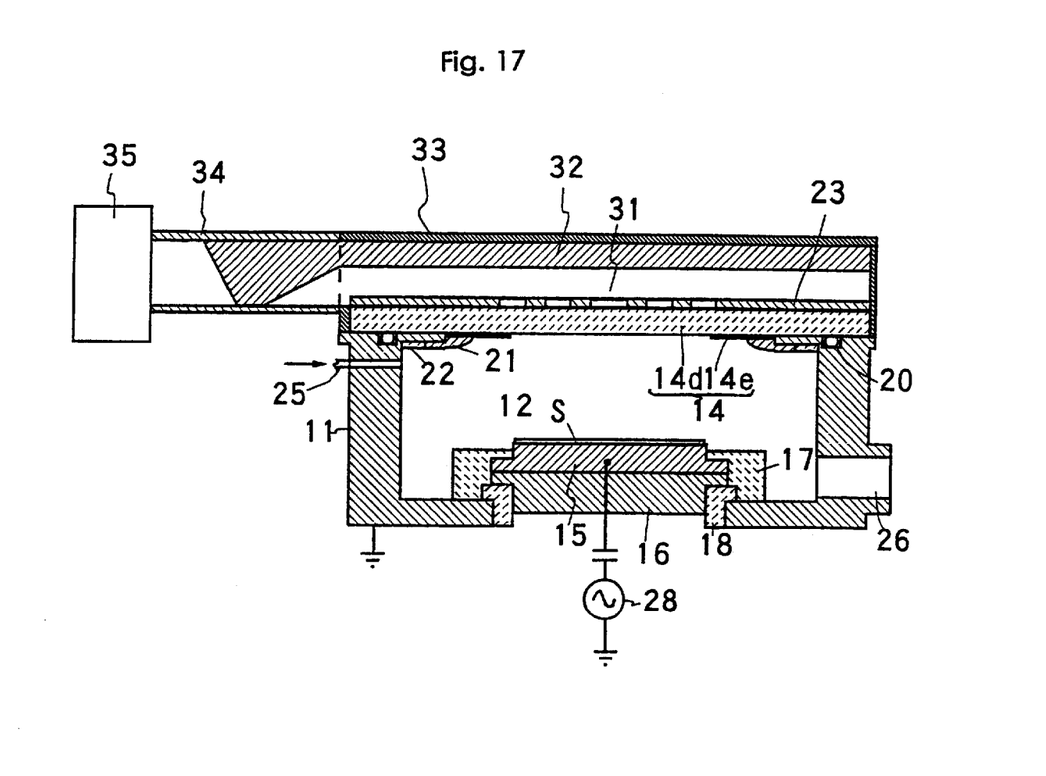
FIG. 17 is a vertical cross-sectional view of a fourth embodiment of the plasma processing of the present invention.

FIG. 17 shows a vertical cross-section of the fourth embodiment of the plasma processing apparatus of the present invention.

The microwave window 14 includes a window main body 14d and an annular member, i.e., annular dielectric member 14e as shown in FIG. 5.

Figure 18:
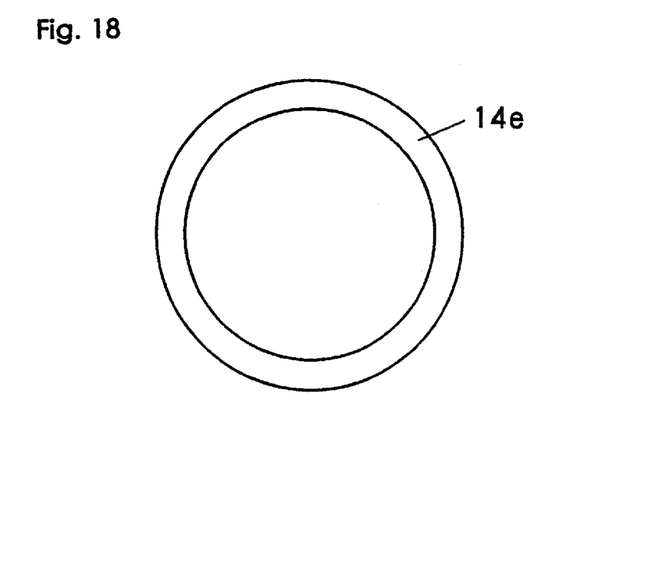
FIG. 18 is a plan view of an example of an annular cross-section of the microwave window of the plasma processing apparatus of the present invention.

FIG. 18 is a plan view of an example of the annular member 14e.

The annular member 14e of complete concentric shape is made of quartz, alumina, or similar.

The plasma processing apparatus is provided with an RF voltage source 28 and counter electrode 21 to implement a plasma process for a sample S, while applying an RF voltage to it, as in the case of the above-described second embodiment. The apparatus has an electrode rim insulating plate 22 of alumina or similar fitted on the outer edge of the electrode 21 so that the counter electrode 21 is insulated from the side wall of the reaction chamber 11. The annular member 14e is press-fitted to the window main body 14d by the counter electrode 21.

The apparatus is further provided with a microwave regulation plate 23 so as to raise the plasma density in the area over the sample S and control the plasma density distribution, as in the case of the above-described third embodiment.

By attaching the annular member 14e to the window main body 14d to thereby provide the microwave window 14 with a greater thickness for its outer section relative to the area confronting the sample S in this manner, it becomes possible to raise the plasma density in the area confronting the sample S to thereby raise the plasma processing rate and improve the etch-through performance for fine hole patterns.

The annular member, i.e., annular dielectric member 14e for directing plasma to the center is shaped properly to meet each plasma process.

The plasma processing apparatus of the present invention is suitable for such a process as etching of a hole pattern of silicon oxide ($SiO_2$) film in which control of the ion is especially crucial.

The following explains the results of experiments conducted with the plasma processing apparatus of the present invention.

The plasma processing apparatus shown in FIG. 15 having the provision of the microwave window shown in FIGS. 11 and 12 and the microwave regulation plate shown in FIG. 16 were used for experiments 1 through 4. Seven kinds of window, all made of quartz with different dimensions listed in the following Table 1, are used.

TABLE 1

| window | depth $H_{A1}$ (mm) | diameter $D_{A1}$ (mm) | diameter $D_{A2}$ (mm) | thickness $T_{W1}$ (mm) | thickness $T_{W2}$ (mm) | |
|---|---|---|---|---|---|---|
| A | 12 | 150 | 258 | 30 | 20 | inventive |
| B | 2 | 150 | — | 20 | 20 | inventive |
| C | 12 | 130 | 258 | 30 | 20 | inventive |
| D | 12 | 170 | 258 | 30 | 20 | inventive |
| E | 12 | 190 | 258 | 30 | 20 | inventive |
| F | 0 | — | 258 | 30 | 20 | comparative |
| G | 0 | — | — | 20 | 20 | comparative |

The plasma processing apparatus shown in FIG. 17 having the provision of the annular member 14e shown in FIG. 18 and the microwave regulation plate 23 shown in FIG. 16 were used for experiments 5 and 6.

The microwave frequency was 2.45 GHz and the RF voltage frequency was 400 kHz throughout the experiments.

EXPERIMENT 1

The plasma processing apparatus, as shown in FIG. 15, having microwave windows of three kinds of recesses depth $H_{A1}$, i.e., windows A ($H_{A1}$=12 mm), B ($H_{A1}$=2 mm) and G ($H_{A1}$=0 mm) in Table 1, was used to measure the etching rate of a silicon oxide film of 1 $\mu$m in thickness formed on a 6-inch wafer. Among the etching conditions, the processing gas was $CHF_3$, the microwave power was 1300 W, and the RF voltage power was 600 W.

Figure 19:
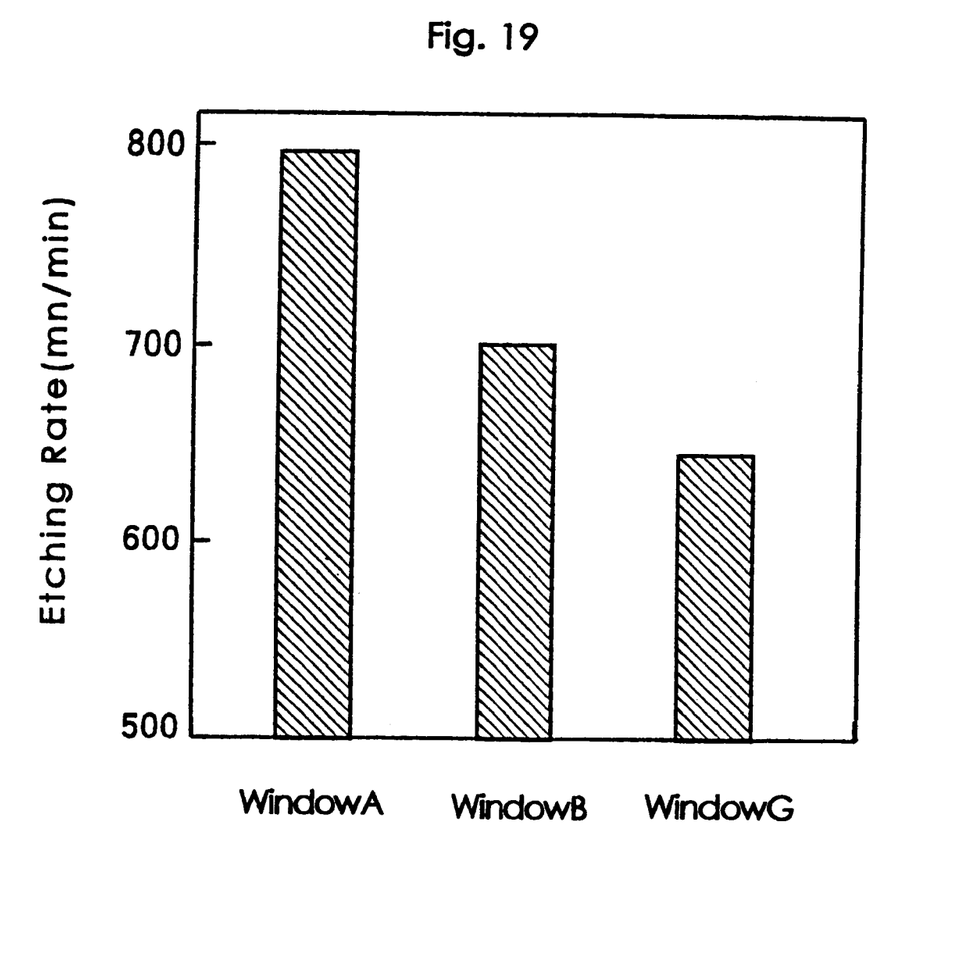
FIG. 19 is a graphical representation of the measurement results of the etching rate achieved by microwave windows with different depths of recession.

FIG. 19 shows the measurement results of etching rate corresponding to these microwave windows.

It was confirmed that the etching rate rises as the recess depths $H_{A1}$ of the window increases.

EXPERIMENT 2

The plasma processing apparatus, having microwave windows with and without a recess, was used to etch a 0.4-$\mu$m hole pattern on a silicon oxide film to thereby evaluate the hole pattern etch-through performance based on the observation of the shape of the etched cross-section. The sample was etched on each expiration of a prescribed plasma discharge time, and it was observed with a scanning electron microscope (SEM).

The window B having a recess and the window G without recess shown in Table 1, were used. A resist pattern layer with 0.4-$\mu$m holes is formed on a silicon oxide film of 1.5 $\mu$m in thickness which is formed on a 6-inch silicon wafer. Among the etching conditions, the processing gas was $CHF_3$, the microwave power was 1300 W, and the RF voltage power was 600 W.

Figure 20A:
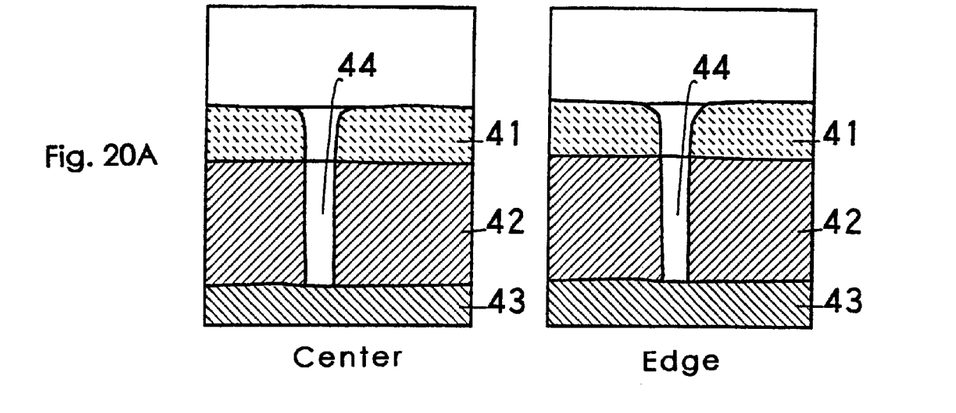
FIGS. 20A, 20B and 20C are illustrations of photographs of etched cross-sections resulting from the etching process with window B based on the present invention after 20 minutes, 570 minutes and 970 minutes, respectively, following plasma discharging.
Figure 20B:
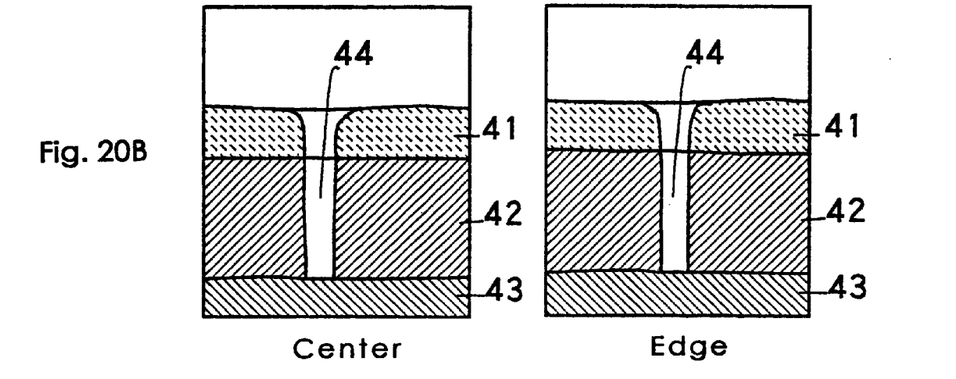
Figure 20C:
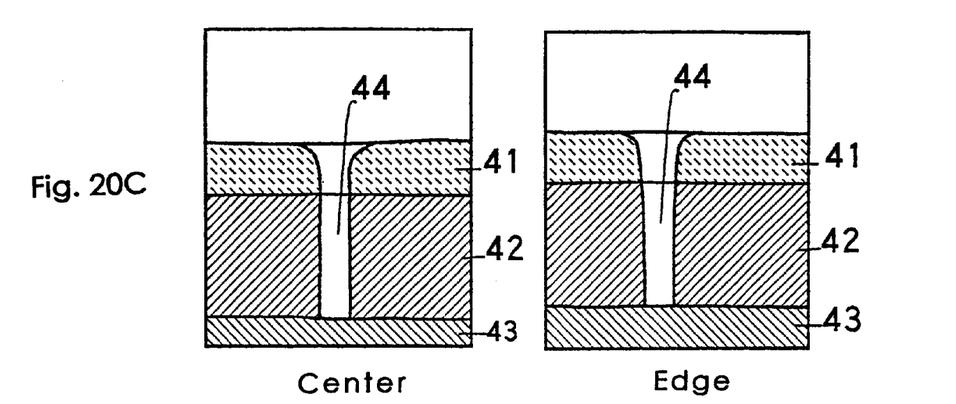

FIGS. 20A, 20B and 20C are illustrations of photographs of etched cross-sections resulting from the etching process with the window B of the present invention after 20 minutes, 570 minutes and 970 minutes, respectively, following plasma discharging.

A silicon oxide film 42, with holes 44 being formed therein, and a resist pattern layer 41 are laminated on a silicon wafer 43. Indicated by "center" is the cross-section of a hole at the center of wafer, and indicated by "edge" is of a hole at the position of 10 mm from the edge of wafer.

Figure 21A:
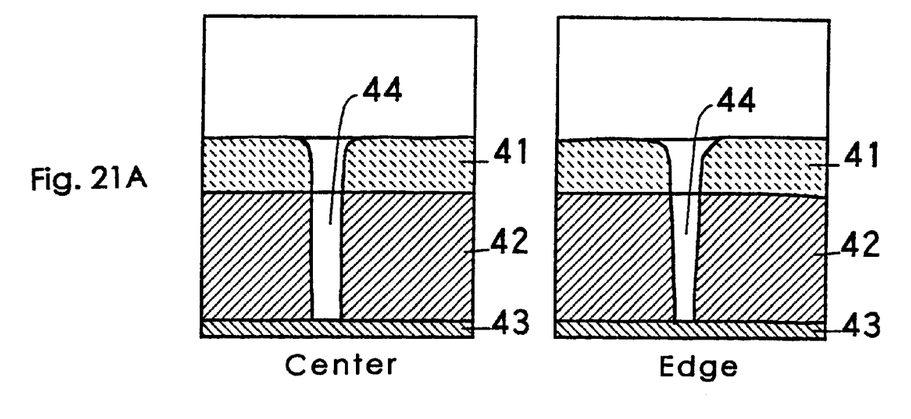
FIGS. 21A, 21B and 21C are illustrations of photographs of etched cross sections resulting from the etching process with window G for comparison after 20 minutes, 570 minutes and 970 minutes, respectively, following plasma discharging.
Figure 21B:
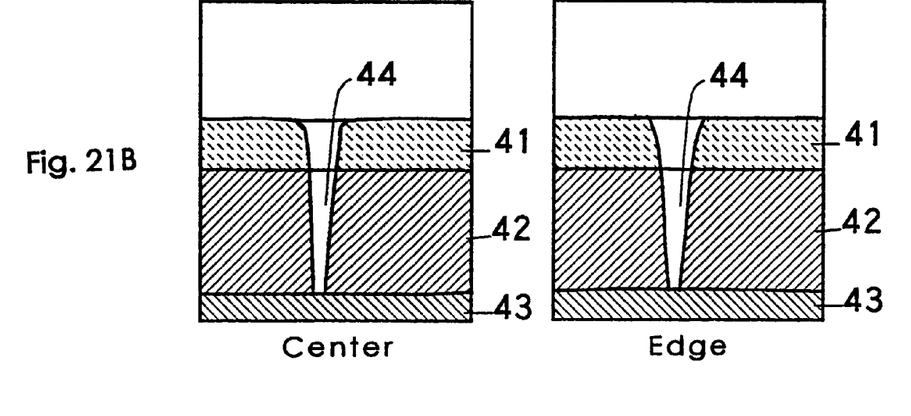
Figure 21C:
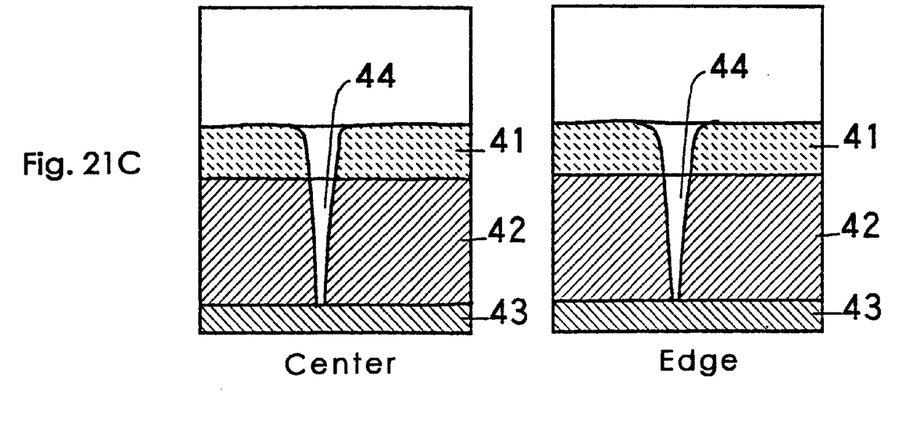

FIGS. 21A, 21B and 21C are illustrations of photographs of etched cross-sections resulting from the etching process with the window G for comparison after 20 minutes, 570 minutes and 970 minutes, respectively, following plasma discharging. Indicated by "center" and "edge" are the same as FIGS. 20A, 20B and 20C.

The observation results of FIGS. 20A, 20B and 20C reveal that the plasma processing apparatus with the microwave window of the present invention is capable of forming through-holes with a vertical parallel profile even after a long plasma discharge time. In contrast, the observation results of FIGS. 21A, 21B and 21C reveal that the plasma processing apparatus with the microwave window for comparison is merely capable of forming through-holes with a vertical parallel profile following a short plasma discharge time (FIG. 21A), and holes are tapered as the plasma discharge time extends (FIGS. 21B and 21C).

It was confirmed accordingly that the etch-through performance of the plasma processing apparatus is enhanced by the formation of a recession on the microwave window.

EXPERIMENT 3

The plasma processing apparatus provided with microwave windows of five kinds of recess diameter $D_{A1}$, i.e., the windows A, C, D, E and F in Table 1 was used to evaluate the uniformity of the etching rate of a silicon oxide film across the wafer. The sample and etching conditions are the same as experiment 1.

Figure 22:
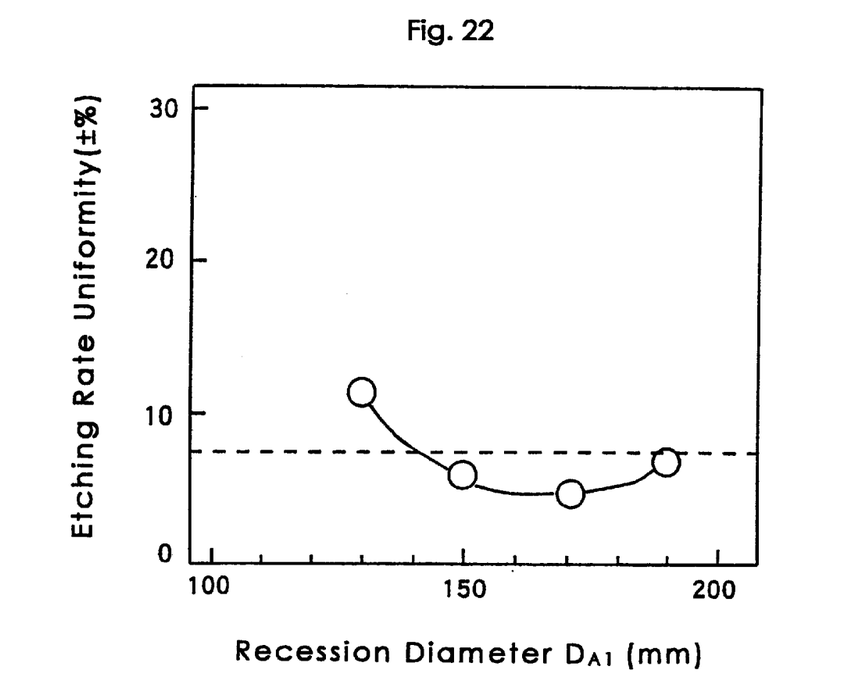
FIG. 22 is a graph showing the measurement result of the uniformity of etching rate in connection with the diameter $D_{A1}$ of recession of the microwave window.

FIG. 22 shows the results of the experiment of the etching rate uniformity plotted against the window recess diameter $D_{A1}$. The dashed line is the result of the experiment with the apparatus having the window F without a recess for comparison.

It was confirmed that the uniformity of the etching rate is improved by the use of a microwave window with a recession diameter $D_{A1}$ ranging from 150 to 180 mm, as compared with the use of a window without a recess.

EXPERIMENT 4

The plasma processing apparatus, having the window A which protects the edge section of the counter electrode and the window G which does not protect the electrode edge section for comparison was used to generate plasma and measure the variation with time of the number of particles of sizes of 0.2 μm or larger on the entire surface of a 6-inch wafer.

Among the etching conditions, the processing gas was $CHF_3$ and CO, the microwave power was 1300 W, and the RF voltage power was 600 W.

Figure 23:
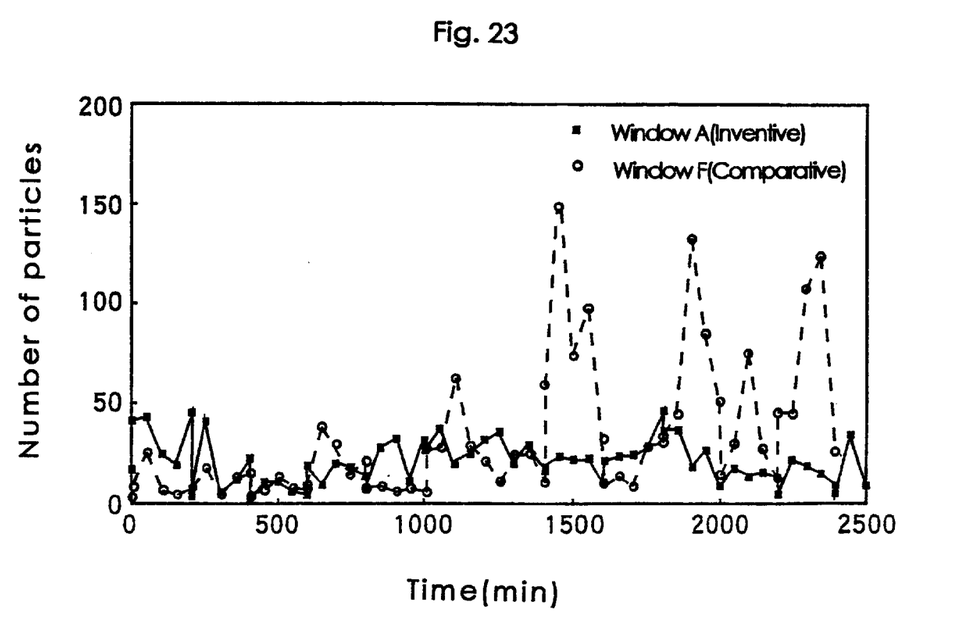
FIG. 23 is a graph showing the variation of the number of particles along the plasma discharge time.

FIG. 23 shows by graph the number of particles plotted against the plasma discharge time.

According to the plasma processing apparatus of the present invention having the window A, the particle count on the wafer was stably within the range of 50. In contrast, according to the apparatus with the window G for comparison, the number of particles exceeds one hundred after a certain time period.

It was confirmed accordingly that the increase with time of the number of particles can be suppressed by shaping the microwave window to protect the edge section of counter electrode.

EXPERIMENT 5

The plasma processing apparatus, shown in FIG. 17, having the microwave regulation plate 23, of FIG. 16, which limits the microwave to go through the central rectangular area, was used to evaluate the effectiveness on the improvement in the plasma processing rate and the uniformity thereof exerted by the annular member 14e for plasma confinement attached to the window main body 14d. The uniformity of plasma processing rate was evaluated in terms of the uniformity of etching rate for a BPSG film on a 6-inch wafer.

Among the etching conditions, the flow rate of $CHF_3$ was 20 sccm, the pressure was 30 mTorr, the microwave power was 1300 W, the RF voltage power was 600 W, and the temperature of sample stage was 0° C. For comparison, the same measurement was conducted with the apparatus without having the annular member 14e.

Figure 24:
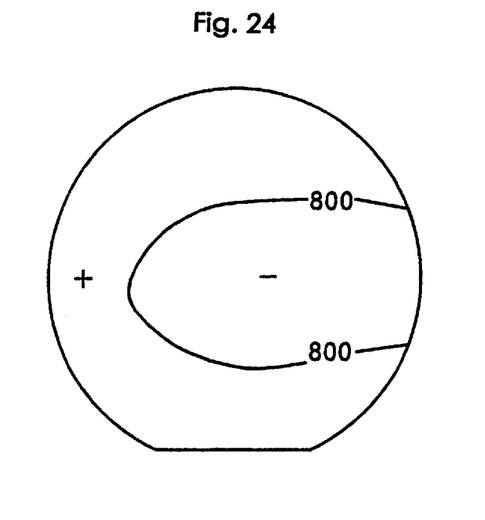
FIGS. 24 and 25 are diagrams showing the distribution of etching rate on the wafer surface based on the present invention and a comparison, respectively.
Figure 25:
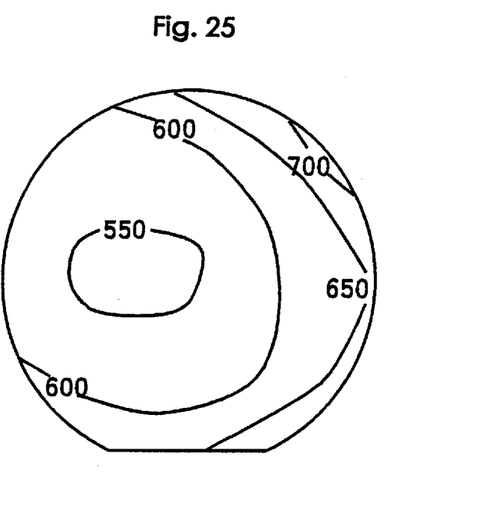

FIG. 24 and FIG. 25 show the distribution of etching rate on the wafer surface. FIG. 24 is of the case with the annular member 14e based on this invention, and FIG. 25 is of the case without it for comparison. The unit of etching rate is nm/min. Symbols "+" and "−" in FIG. 24 indicate the areas of etching rate of 800 nm/min or higher and lower than 800 nm/min, respectively.

It was confirmed that the inventive apparatus improves the etching rate and its uniformity (shown in FIG. 24) as compared with the conventional apparatus (shown in FIG. 25).

EXPERIMENT 6

The influence of the plasma-confining annular member 14e on the plasma density was examined by measuring the plasma density with the Langmuir probe placed at the position of 40 mm from the microwave window at the center of the sample stage.

Among the plasma generation conditions, the flow rate of $CHF_3$ was 20 sccm, the microwave power was 1300 W, the pressure was varied in the range of 10–80 mTorr, and no RF voltage power was applied.

Figure 26:
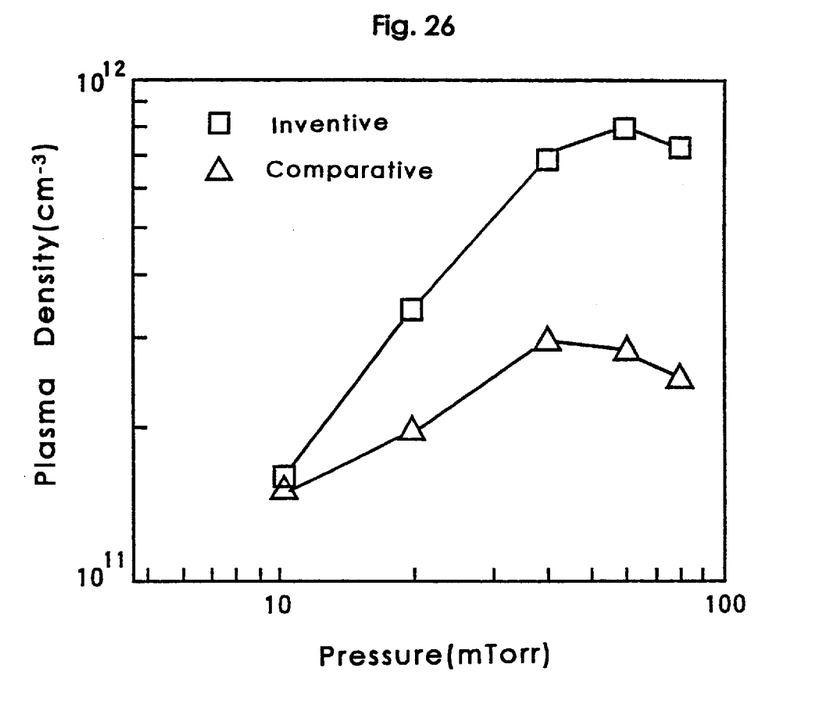
FIG. 26 is a graph showing the measurement result of the plasma density.

FIG. 26 shows by graph the measurement results of plasma density derived from the apparatus with the annular member 14e based on the present invention as plotted by symbol □ and from the apparatus without it for comparison as plotted by symbol Δ.

It was confirmed that the inventive apparatus with the provision of the plasma confinement means is capable of raising the plasma density significantly (shown by plots □).

INDUSTRIAL APPLICABILITY

The plasma processing apparatus of the present invention are capable of improving the plasma processing rate for samples by raising the plasma density in a specific area of the reaction room. The plasma processing apparatus and plasma processing method of the present invention are capable of improving the etch-through performance for fine hole patterns.

The plasma processing apparatus of the present invention are capable of improving the uniformity of plasma processing rate based on the optimized shape of the recess formed on the microwave window. The plasma processing apparatus and plasma processing method of the present invention are capable of reducing the number of particles based on the shaping of the microwave window so as to protect the edge section of the electrode, in case it needs to be located near the microwave window.

Consequently, the plasma processing apparatus of the present invention when used for the manufacturing of large-scale integrated circuits (LSIs) and liquid crystal display panels (LCDs) are capable of improving the yield.

We claim:

1. A plasma processing apparatus comprising:

a reaction chamber having an upper opening for supplying microwaves;

a sample stage being settled inside said reaction chamber, to place a sample;

a microwave generator;

a waveguide connected to said microwave generator for supplying the microwave provided by said generator; and a microwave window covering the upper opening of reaction chamber, to introduce the microwave supplied through said waveguide into the reaction chamber, wherein an inner area of said microwave window directly confronting a sample which is placed on said sample stage is thinner than an outer area of said microwave window, wherein said inner area is at least as large as said sample, wherein said inner area of said microwave window has an unobstructed view of all of said sample stage, and wherein said microwave window is larger than said sample stage.

2. The plasma processing apparatus according to claim 1, wherein said microwave window has an annular dielectric member attached to a periphery of said area confronting said sample stage.

3. The plasma processing apparatus according to claim 1, further comprising means for applying an RF voltage to said sample stage, and a counter electrode which is located to confront said sample stage at a rim section of said microwave window inside of said reaction chamber and which is electrically grounded.

4. The plasma processing apparatus according to claim 2, further comprising means for applying an RF voltage to said sample stage, and a counter electrode which is located to confront said sample stage at a rim section of said microwave window inside of said reaction chamber and which is electrically grounded.

5. The plasma processing apparatus according to claim 1, wherein the periphery of the inner area of said microwave window is tapered.

6. The plasma processing apparatus according to claim 1, wherein the periphery of the inner area of said microwave window is stepped.

* * * * *